US009852792B2

(12) United States Patent
Muralimanohar et al.

(10) Patent No.: US 9,852,792 B2
(45) Date of Patent: Dec. 26, 2017

(54) NON-VOLATILE MULTI-LEVEL-CELL MEMORY WITH DECOUPLED BITS FOR HIGHER PERFORMANCE AND ENERGY EFFICIENCY (71) Applicant: Hewlett-Packard Development Company, L.P., Houston, TX (US)

(72) Inventors: Naveen Muralimanohar, Palo Alto, CA (US); Han Bin Yoon, Palo Alto, CA (US); Norman Paul Jouppi, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/764,135

(22) PCT Filed: Jan. 31, 2013

(86) PCT No.: PCT/US2013/024090
§ 371 (c)(1),
(2) Date: Jul. 28, 2015

(87) PCT Pub. No.: WO2014/120193
PCT Pub. Date: Aug. 7, 2014

(65) Prior Publication Data
US 2015/0364191 A1    Dec. 17, 2015

(51) Int. Cl.
*G11C 11/34* (2006.01)
*G11C 13/00* (2006.01)
(Continued)

(52) U.S. Cl.
CPC ...... *G11C 13/0061* (2013.01); *G06F 12/0246* (2013.01); *G11C 11/5628* (2013.01);
(Continued)

(58) Field of Classification Search
CPC ...................... G06F 3/0679; G06F 2003/0691
(Continued)

(56) References Cited

U.S. PATENT DOCUMENTS 7,149,110 B2   12/2006  Tran et al.
7,742,345 B2   6/2010   Kwean
(Continued)

FOREIGN PATENT DOCUMENTS

KR    1020100070026 A    6/2010

OTHER PUBLICATIONS

Hanbin Yoon et al, Data Mapping for Higher Performance and Energy Efficiency in Multi-Level Phase Change Memory, Carnegie Mellon University, HP Labs, XP055236806, Mar. 6, 2012, 2 Pgs.
(Continued)

*Primary Examiner* — Anthan Tran
(74) *Attorney, Agent, or Firm* — Hewlett Packard Enterprise Patent Department (57) ABSTRACT

A non-volatile multi-level cell ("MLC") memory device is disclosed. The memory device has an array of non-volatile memory cells, an array of non-volatile memory cells, with each non-volatile memory cell storing multiple groups of bits. A row buffer in the memory device has multiple buffer portions, each buffer portion storing one or more bits from the memory cells and having different read and write latencies and energies.

7 Claims, 12 Drawing Sheets

(51) Int. Cl.
*G11C 16/26* (2006.01)
*G06F 12/02* (2006.01)
*G11C 11/56* (2006.01)
*G11C 16/10* (2006.01)

(52) U.S. Cl.
CPC ...... *G11C 11/5678* (2013.01); *G11C 11/5685* (2013.01); *G11C 13/0002* (2013.01); *G11C 13/004* (2013.01); *G11C 13/0004* (2013.01); *G11C 13/0069* (2013.01); *G11C 16/10* (2013.01); *G11C 16/26* (2013.01); *G11C 2207/2272* (2013.01); *Y02B 60/1225* (2013.01)

(58) Field of Classification Search
USPC .................................................... 365/185.03
See application file for complete search history.

(56) References Cited

U.S. PATENT DOCUMENTS

| | | | |
|---|---|---|---|
| 7,996,727 | B2 | 8/2011 | Tran et al. |
| 8,230,154 | B2 | 7/2012 | Isaac et al. |
| 2007/0035995 | A1* | 2/2007 | Crippa .................. G11C 16/10 365/185.03 |
| 2009/0157946 | A1 | 6/2009 | Arya |
| 2010/0149869 | A1 | 6/2010 | Kim et al. |
| 2010/0293352 | A1 | 11/2010 | Nakaoka |
| 2011/0087838 | A1 | 4/2011 | Chung-Kuang et al. |
| 2011/0199822 | A1* | 8/2011 | Yoon .................. G11C 11/5628 365/185.03 |
| 2011/0252188 | A1 | 10/2011 | Weingarten et al. |
| 2011/0275186 | A1 | 11/2011 | Fumitoshi et al. |
| 2011/0302475 | A1 | 12/2011 | Eisenhuth et al. |
| 2012/0023283 | A1* | 1/2012 | Yang .................. G06F 12/0246 711/103 |
| 2012/0079167 | A1 | 3/2012 | Hiroshi et al. |
| 2012/0173827 | A1* | 7/2012 | Wood .................. G11C 11/5621 711/154 |
| 2012/0210082 | A1 | 8/2012 | Eran et al. |

OTHER PUBLICATIONS

PCT Search Report/Written Opinion—Application No. PCT/US2013/024090 dated Oct. 25, 2013—9 pages.

Wang, J. et al. "Energy-efficient Multi-level Cell Phase-change Memory System with data Encoding", 2011, 8 Pages.

Yoon, H, et al, "DynRBLA: A High Performance and Energy-Efficient Row Buffer Locality-Aware Caching Policy for Hybrid Memories", 2011, 16 Pages.

* cited by examiner

NON-VOLATILE MULTI-LEVEL-CELL MEMORY WITH DECOUPLED BITS FOR HIGHER PERFORMANCE AND ENERGY EFFICIENCY

BACKGROUND

Non-volatile memories such as memristors and Phase Change Memory ("PCM") have emerged as promising and scalable alternatives to currently prevalent memory technologies like Dynamic Random Access Memory ("DRAM") and Flash memory. In addition to a fundamentally different approach to storing data that leads to a higher memory density, a lower cost per bit, and a larger capacity than DRAM and Flash, these emerging non-volatile memories support multi-level cell ("MLC") technology, which allows each memory cell to store two or more bits (DRAM, in contrast, can only store one bit per cell). The potential to operate at a lower power further adds to memristors' and PCM's competitiveness as scalable DRAM alternatives.

In particular, PCM is an emerging memory technology that stores data by varying the electrical resistance of a material known as chalcogenide. By applying heat, and then allowing it to cool at different rates, chalcogenide can be manipulated to settle between an amorphous (quickly quenched) high resistance state (e.g., a logic low or zero) and a crystalline (slowly cooled) low resistance state (e.g., a logic high or one). PCM is non-volatile, as the state of chalcogenide is retained in the absence of electrical power. The large resistance difference by three orders of magnitude) between the amorphous and crystalline states of a PCM cell enables MLC technology to be implemented in PCM cells. This is achieved by partitioning the large resistance difference into four distinct regions, each representing a two-bit value of "11", "10", "01", and "00". More than one bit can be stored in a cell by controlling its resistance precisely to lie within one of these resistance regions.

Supporting MCL in PCM, however, incurs higher access latency and energy. MLC requires the cell resistance to be controlled precisely to lie within a narrower range, which necessitates iterative writing and reading techniques with multiple sensing iterations that lead to higher read latency and energy as well as higher write latency and energy.

BRIEF DESCRIPTION OF THE DRAWINGS

The present application may be more fully appreciated in connection with the following detailed description taken in conjunction with the accompanying drawings, in which like reference characters refer to like parts throughout, and in which.

DETAILED DESCRIPTION

A non-volatile multi-level-cell ("MLC") memory with decoupled bits for higher performance and energy efficiency is disclosed. The non-volatile MLC memory, as generally described herein, is a non-volatile memory having multiple memory cells, with each memory cell storing more than one bit. In various examples, the non-volatile MLC memory can be a non-volatile memory (e.g., PCM, memristor, etc.) storing multiple groups of bits per cell, where each group can have one or more bits. For example, a memory cell can store two groups of bits, with each group having a single bit (for a total of two bits stored per cell). One group can store a Most-Significant Bit ("MSB") and another group can store a Least-Significant Bit ("LSB"). In another example, a memory cell can store four groups of bits, with each group having a single bit (for a total of four bits stored per cell). And in yet another example, a memory cell can store two groups of bits, with each group having two bits (also for a total of four bits per cell). Various other examples are contemplated and described in more detail below.

The non-volatile MLC memory divides each memory cell into groups. A row buffer having multiple buffer portions is used to store the bits from the memory cell, with each buffer portion having different read and write latencies and energies. For ease of explanation, the following description may refer to the first example, where a memory cell has two groups of bits with each group having a single bit. In this example, the MLC memory has an MSB half storing an MSB bit and an LSB half storing an LSB bit. The MSB half has a reduced read latency and energy while the LSB half has a reduced write latency and energy. The MSB bits from the MSB halves of the memory are stored in an MSB buffer portion of a row buffer, and the LSB bits from the LSB halves of the memory are in turn stored in an LSB buffer portion of the row buffer. Blocks of data in the MSB buffer may be interleaved with blocks of data in the LSB buffer to increase the chances of coalescing writes to the memory and improve its write endurance.

It is appreciated that, in the following description, numerous specific details are set forth to provide a thorough understanding of the examples. However, it is appreciated that the examples may be practiced without limitation to these specific details. In other instances, well known methods and structures may not be described in detail to avoid unnecessarily obscuring the description of the examples. Also, the examples may be used in combination with each other.

Figure 1:
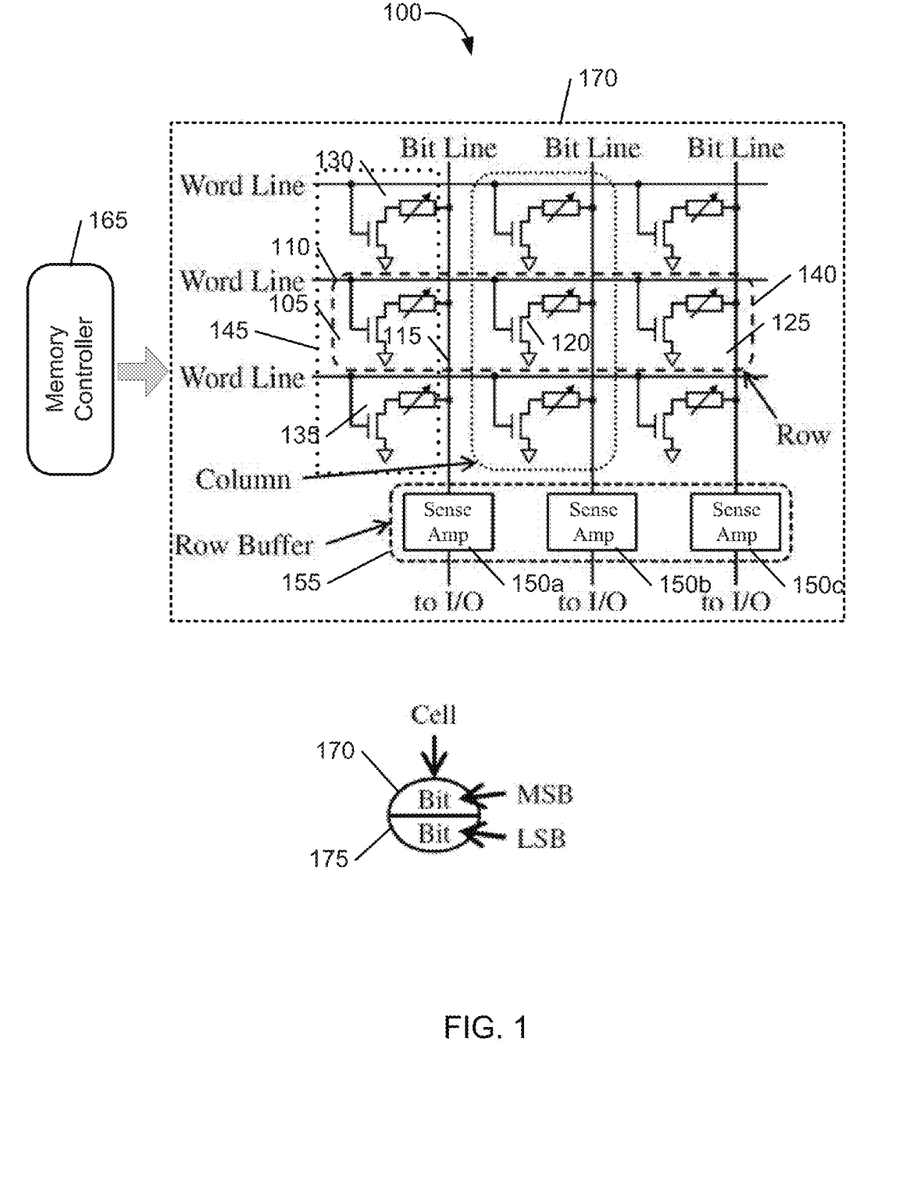
FIG. 1 is a schematic diagram of a non-volatile MLC memory in accordance with various examples.

Referring now to FIG. 1, a schematic diagram of a non-volatile MLC memory in accordance with various examples is described. Non-volatile MLC memory 100 comprises arrays of memory cells and peripheral circuitry. In an array, memory cells are organized into rows and columns, where all of the cells in each row are connected to a common word line, and all of the cells in each column are connected to a common bit line (every cell is connected to one word line and one bit line). For example, memory cell 105 is connected to word line 110 and bit line 115. Memory cell 105 is on the same row 140 as memory cells 120 and 125, and on the same column 145 as memory cells 130 and 135. One skilled in the art will recognize that memory 100 is shown with 9 memory cells for purposes of illustration only. A typical memory 100 may have additional cells.

When accessing data in memory 100, a row of cells (e.g., row 140) is accessed simultaneously. In doing this, a row decoder (not shown) asserts a word line to select all of the cells in the target row, and the bit lines transmit data between the cells and the peripheral circuits. In the peripheral circuits, data signals from the bit lines are detected by sense amplifiers 150a-c in a row buffer 155 and latched in the row buffer 155, and a column decoder (not shown) selects a subset of the row buffer 155 to be communicated with I/O pads (not shown).

It is appreciated that memory 100 may be logically divided into blocks commonly referred to as memory banks. A memory bank is the minimum partition of memory 100 that can be independently addressed. For example, memory 100 is illustrated with a memory bank 170. Each row in memory bank 170 delivers a large number of bits to the sense amplifiers 150a-c. The number of bits delivered is a multiple of a processor word (e.g., 32 or 64 bits). The memory bank 170 is controlled by a memory controller 165, which provides the interface between the memory banks in memory 100 and a processor(s) (not shown). The memory controller 165 reads, writes, and refreshes memory 100 through a combination of multiplexers and demultiplexers that select the right row, column, and memory location for the data.

Once a row's data is placed in the row buffer 155, subsequent data requests to the same row can be served by accessing the data in this buffer. Such an access is known as a row buffer hit, and can be served quickly at the access latency of the row buffer 155 without interacting with the slower cell array. However, in order to serve a data request to another row, data must be accessed from the array (replacing the contents of the row buffer 155). This type of access is known as a row buffer miss, and incurs higher latency and energy consumption due to activating a row of cells in the array.

Applications with high data locality benefit from large row buffers and incur reduced memory access time. But with multi-core processors, memory requests from multiple threads (processes) become interleaved while accessing the same memory bank, resulting in increased row buffer conflicts, and hence high row buffer miss rates. This also increases the contention at the memory controller 165 as memory requests tend to wait longer at the memory controller 165 before being issued. A possible solution to this problem is to increase memory parallelism by supporting multiple row buffers for each bank. Thus an active row buffer's content may be less likely to get thrashed due to a conflicting access from another thread (process). However, this approach significantly increases the area overhead and memory cost.

As described in more detail below, the MLC characteristics of memory 100 may be exploited to effectively achieve multiple row buffers at a very low area overhead. Each memory cell in memory 100 has an MSB 170 and a LSB 175. The MSBs from all cells in memory bank 170 may be stored in an MSB buffer portion of row buffer 155, and the LSBs from all cells in memory bank 170 may in turn be stored in an LSB buffer portion of the row buffer 155. By having the row buffer 155 effectively be divided into two row buffer portions, significant improvements in memory latency and row buffer hits may be achieved. Also, as described below, the memory latency of memory 100 is actually dependent on the type of bits in a memory cell. MSBs have a lower read latency and energy than LSBs, which in turn, have a lower write latency and energy than MSB bits.

Figure 2A:
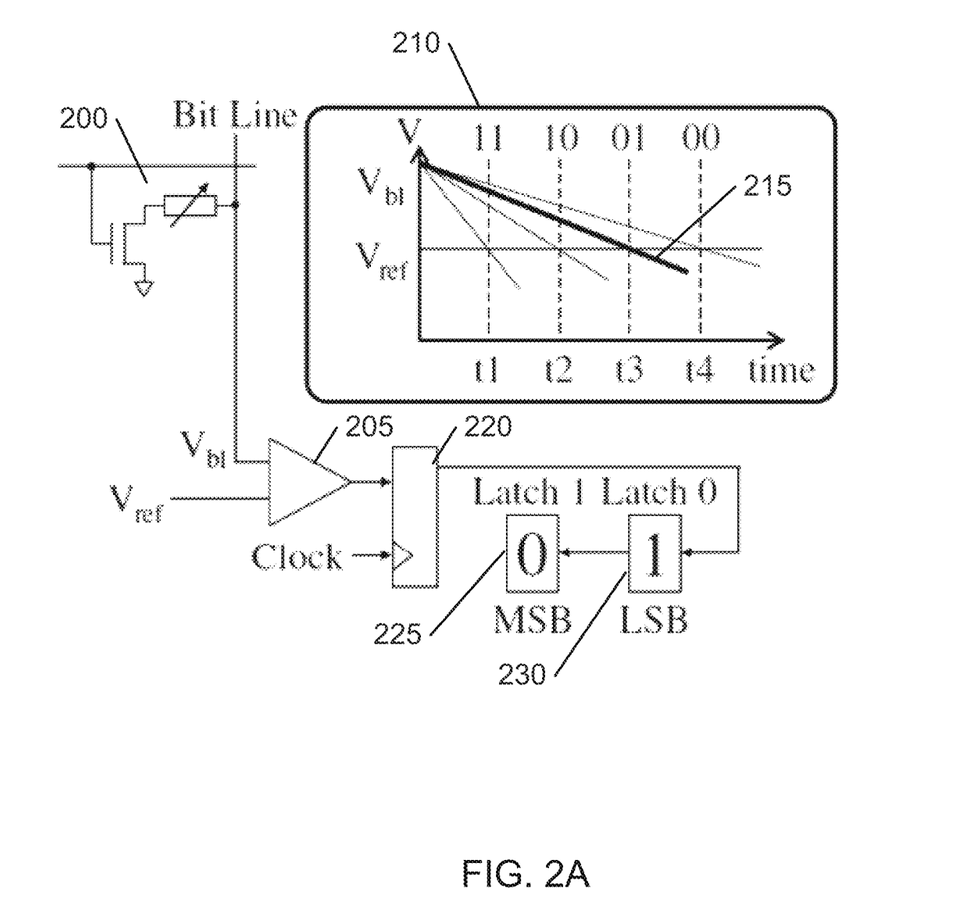
FIGS. 2A-B are schematic diagrams illustrating the read latency of a memory cell in accordance with various examples.

Referring now to FIGS. 2A-B, schematic diagrams illustrating the read latency of a memory cell in accordance with various examples are described. In FIG. 2A, an integrating analog-to-digital converter ("ADC") quantizes the resistance of a cell 200 to a 2-bit value by sensing the time taken for a row of electrical charge (i.e., current) pass through the cell 200. Graph 210 shows the sensing time sensed by sense amplifier 205 as a function of voltage. The higher the resistance, the longer the sensing time. Consequently, the read latency is bounded by the time taken to sense the highest cell resistance.

As seen in graph 210, it is possible to discern some information about the cell's data before the read operation is carried out to completion. Each sensing time gives information as to the bits stored in the cell 200. For example, the bold line 215 in graph 210 shows that at a sensing time of t3, the bits stored in the cell 200 are "01", or a "0" MSB and a "1" LSB. The sense amplifier 205, when sensing the time t3, outputs the "01" bits through an analog to digital converter 220, with the "0" MSB stored in a latch 225 and the "1" LSB stored in a latch 230.

Figure 2B:
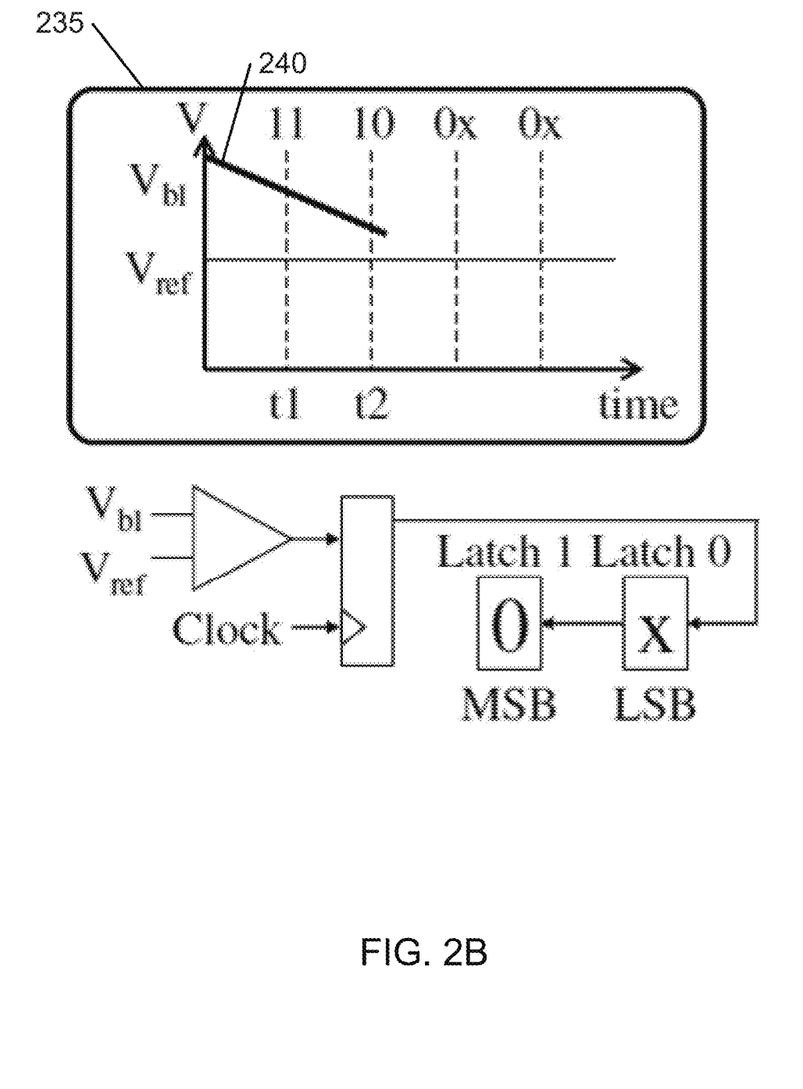

As illustrated in FIG. 2B, the MSB can be determined half way through the read operation. In this example, if the cell resistance is determined by half way through the read operation, the MSB is a '1', else it is a '0', irrespective of the LSB. This can be seen in graph 235 with bold line 240, which represents half of the read operation shown in graph 210 with bold line 215. At a time t2 earlier than a time t3, it can already be determined that the bits stored in the cell 200 are "01". That is, MSBs can be read before a read operation is completed.

This observation indicates that MSBs have a lower read latency (and energy) than LSBs. However, this read asymmetry property is not exploited in conventional non-volatile MLC memories, where a block of data is spread across MSBs and LSBs. This delays the serving of a memory read request until the slower LSBs are ready. If, on the other hand, MSBs and LSBs are mapped to logically separate memory addresses, data blocks stored in MSBs could be read at a lower latency (while data blocks stored in LSBs would be read at the same latency as before).

Figure 3A:
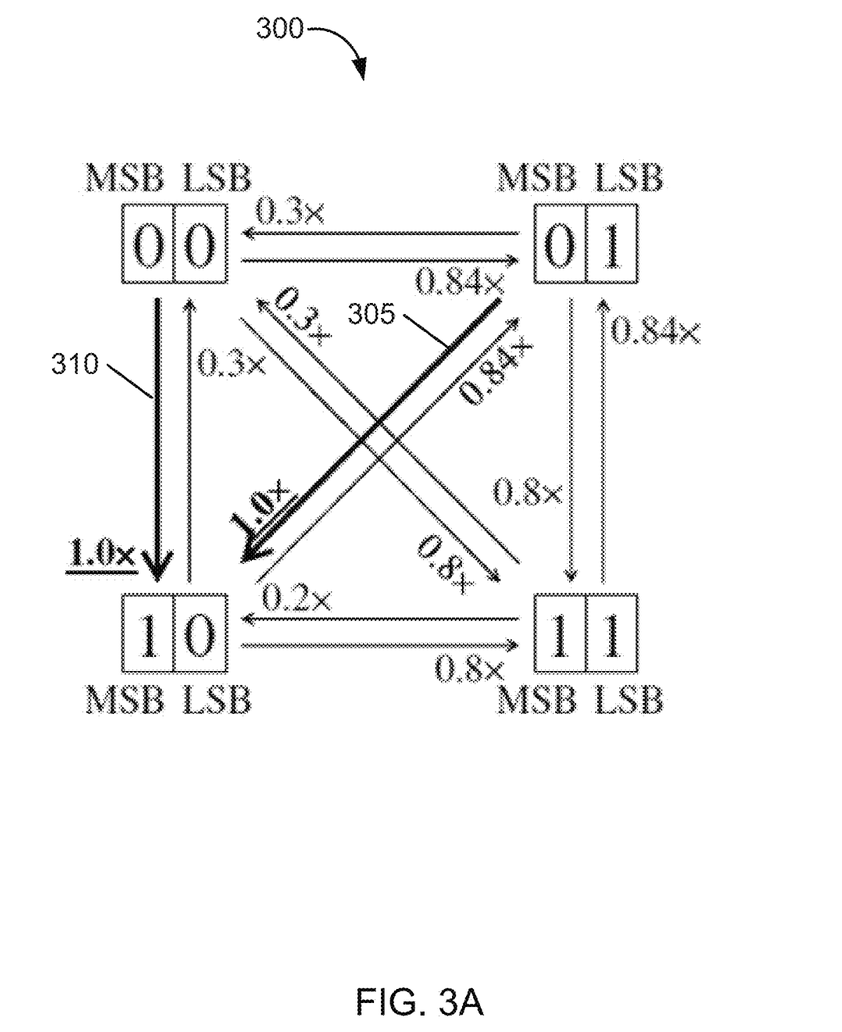
FIGS. 3A-B are schematic diagrams illustrating the write latency of a memory cell in accordance with various examples.
Figure 3B:
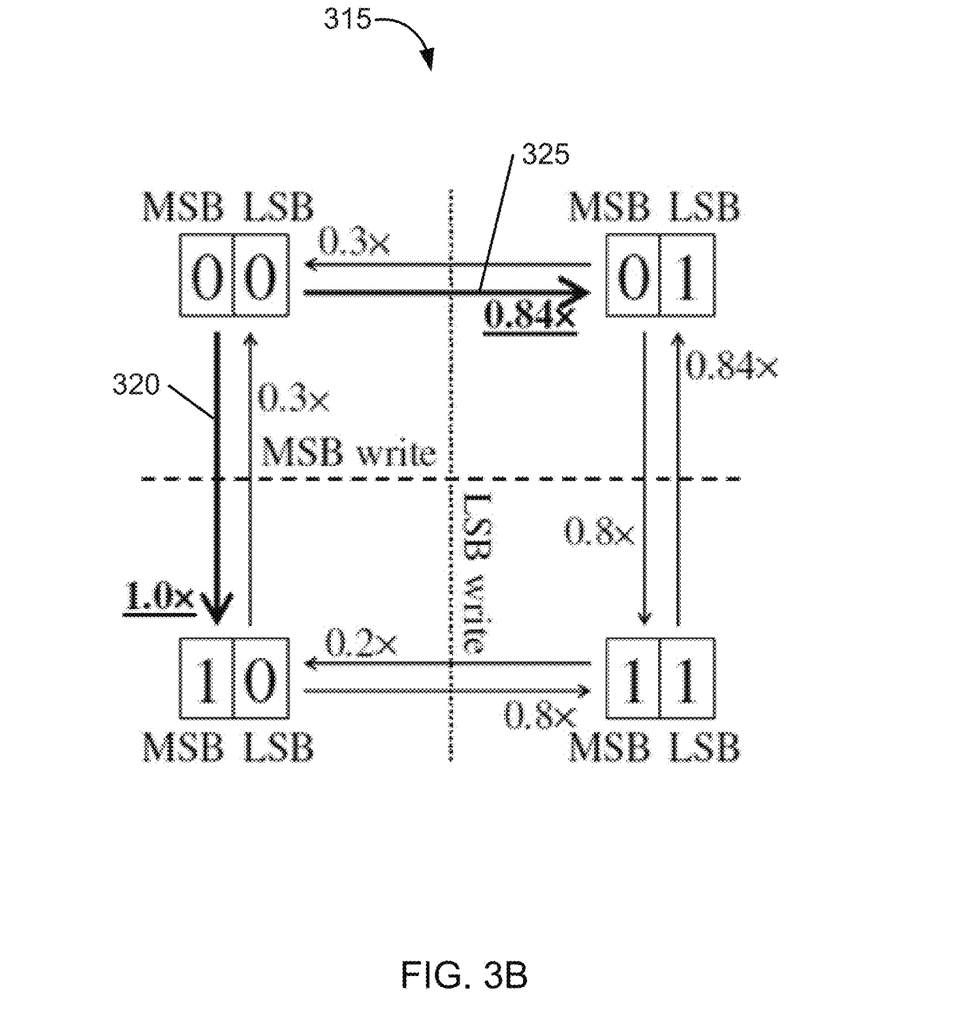

A similar write asymmetry can be observed in a MLC PCM, with the LSBs having a lower write latency and energy than MSBs. Referring now to FIGS. 3A-B, schematic diagrams illustrating the write latency of a memory cell in accordance with various examples are described. The write latency of a multi-level PCM cell depends on two things: the initial state of the cell, and the target state of the cell. This is illustrated in FIG. 3A with diagram 300, which shows the latencies incurred in transitioning a memory cell from any one state to another in a 4-level PCM write operation. For any transition, the write latency is optimized by using a programming method (either partially crystallizing amorphous chalcogenide, or partially amorphizing crystalline chalcogenide) that accomplishes the target cell resistance at a lower latency.

When writing arbitrary data to blocks of cells, the write latency is bounded by the longest time to complete any of the transitions (highlighted in bold in FIG. 3A with bold line 305 between memory cell state "01" and state "10" and bold line 310 between state "00" and state "10"). However, if we do not alter both LSB and MSB in a single write operation (such that the diagonal transitions in FIG. 3A are not being used), then altering the LSB incurs lower latency than altering the MSB. For example, changing the LSB from "0" to "1" incurs a 0.8× or 0.84× write latency, and changing the LSB from "1" to "0" incurs a 0.3× or a 0.2× write latency.

FIG. 3B highlights that changing the MSB only (with bolded line 320 in diagram 315) is bounded by a 1.0× latency (from "00" to "10"), whereas changing the LSB only is bounded by a lower 0.84× latency3 (from "00" to "01, bolded line 325). Programming the memory cell to "10" incurs a 0.2× latency only when transitioning from "11" that is already in the crystalline state, where partial amorphizing requires reset pulses to be applied. This observation indicates that LSBs have a lower write latency (and energy) than MSBs. However, similar to the read asymmetry discussed above with reference to FIGS. 2A-B, this property is not leveraged in conventional MCL PCMs when a block of data is spread across LSBs and MSBs. If LSBs and MSBs are mapped to logically separate memory addresses as described below, data blocks stored in LSBs can be written at a lower latency (while data blocks stored in MSBs would be written at the same latency as before).

Figure 4:
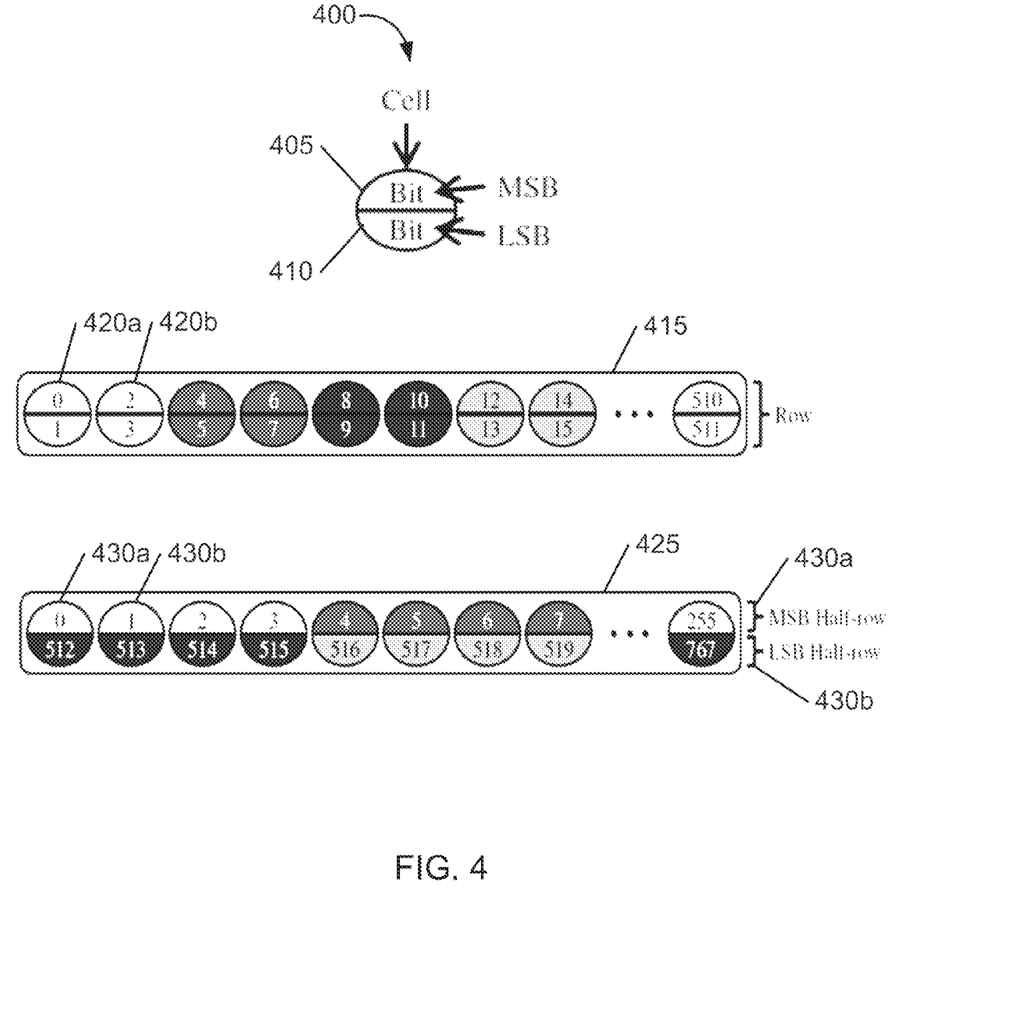
FIG. 4 is a schematic diagram illustrating how MSBs and LSBs can be decoupled in non-volatile multi-level memory cells to take advantage of read and write latency and energy asymmetries.

Attention is now directed to FIG. 4, which shows how MSBs and LSBs can be decoupled in MLC PCM cells to take advantage of these read and write asymmetries. Each memory cell 400 of a MLC PCM (e.g., memory 100 shown in FIG. 1) has an MSB and a LSB. In a conventional MLC PCM, these bits are coupled to form a single contiguous memory address along a row, as shown with row 415. Row 415 illustrates that the memory address goes from cell to cell in a sequential or contiguous manner. The first cell 420a in row 415 is addressed before the second cell 420b, with the MSB addressed before the LSB. For illustration, data blocks the size of 4 bits are highlighted in different shades. The 4-bit block formed by cells 420a-b is addressed first with the MSB in cell 420a (labeled "0"), followed by the LSB in cell 420a (labeled "1"), the MSB in cell 420b (labeled "2"), and the LSB in cell 420b (labeled "3"). This pattern goes on throughout the row 415.

In contrast, the non-volatile MLC memory presented herein (e.g., memory 100 in FIG. 1) groups the MSBs along a row to form one contiguous address, and groups the LSBs along the same row to form another contiguous address. This way, a data block (e.g., a 64 byte cache block) that resides at a certain logical address physically occupies only MSBs or only LSBs. If the data block is in MSBs, read asymmetry (discussed above with reference to FIGS. 2A-B) is exploited to read the block at a reduced latency and energy. Likewise, if the data block is in LSBs, write asymmetry (discussed above with reference to FIGS. 3A-B) is exploited to write to the block at a reduced latency and energy.

Decoupling the bits effectively divides all rows in memory into two logical addresses; one using MSBs, the other using LSBs. For example, row 425 is effectively divided into an MSB half-row 430a and a LSB half-row 430b. In contrast to row 415 of a conventional MLC PCM in which bits are addressed in a contiguous manner throughout the row, with the memory presented herein (e.g., memory 100 in FIG. 1), all bits of the MSB half-row 430a are addressed first before all bits of the LSB half-row 430b. The MSB of the first cell 430a is addressed before the MSB of the second cell 430b, and so on, until the end of the MSB half-row 430a. Only after all the MSBs of a memory bank are addressed, the LSBs in the LSB half-row 430b are accounted for.

Figure 5:
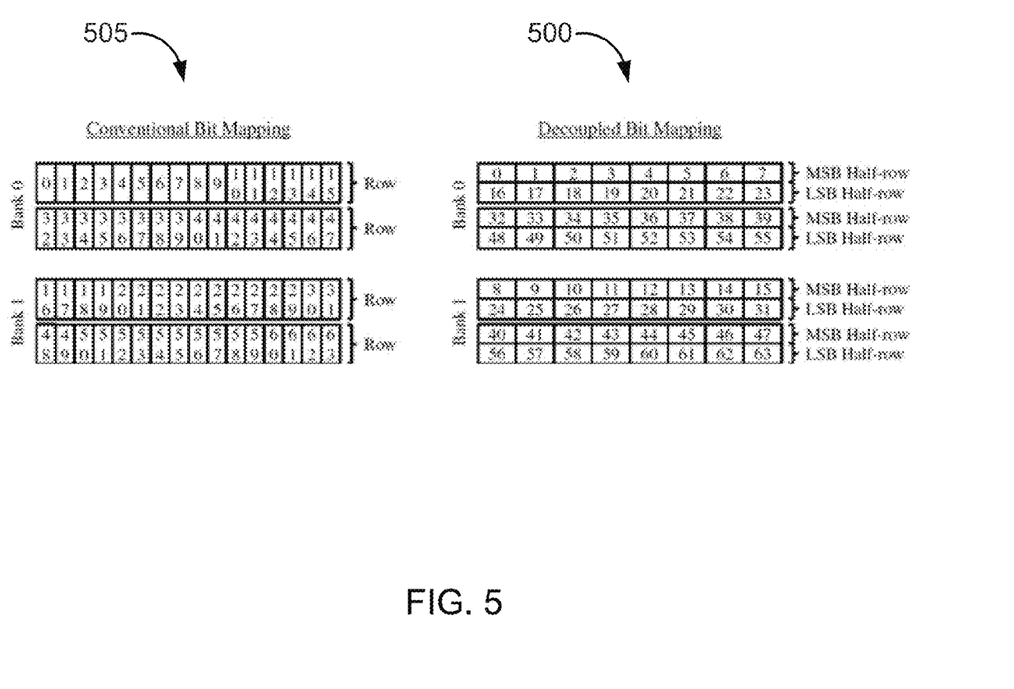
FIG. 5 is a schematic diagram contrasting the data block address mapping in accordance with various examples presented herein to the conventional scheme.

FIG. 5 contrasts the data block address mapping proposed herein and the conventional scheme. Assuming an arbitrary random translation from an application's virtual page address to a physical frame address in memory, roughly half of the application's working set would be in MSBs and the other half in LSBs. Hence with the data block address mapping 500 proposed here, 50% of the memory reads are served at a reduced latency (by 48%) and energy (by 48%), and 50% of the memory writes are served at a reduced latency (by 16%) and energy (by 26%), on average.

The downside of the data block address mapping 500 is that it increases the number of cells that are programmed during a write operation, adding to the endurance overhead. This is because a data block assumes only one bit from each 2-bit cell, involving a number of cells equal to the number of bits in a block when writing to the block. However, this does not double the endurance overhead compared to the conventional scheme, as the probability that programming a cell will be redundant (because it is already in the target state to be programmed to) is lower in the conventional scheme, where both the MSB and LSB have to match with the write data.

On the other hand, writing data to a block in 500 targets only MSBs or only LSBs, thus a block-write has more redundant bit-writes. Simulations show an average of 21% endurance overhead. This is small enough to achieve the typical server design lifetime of 5 years, considering that prior work has shown that PCM main memory has an average lifetime of 8.8 years. By employing the data block address mapping 500, two separate logical addresses spaces share the row buffer space, with each address space occupying half of the row buffer. This reduces the longest contiguous address space that can be held in the row buffer, potentially decreasing row buffer locality. However, the reduced memory access latencies exposed by the data block address mapping 500 more than compensate for this effect, significantly improving system performance (and energy efficiency) over the conventional data block address mapping 505, while not incurring major modifications to the memory circuitry and architecture.

Figure 6:
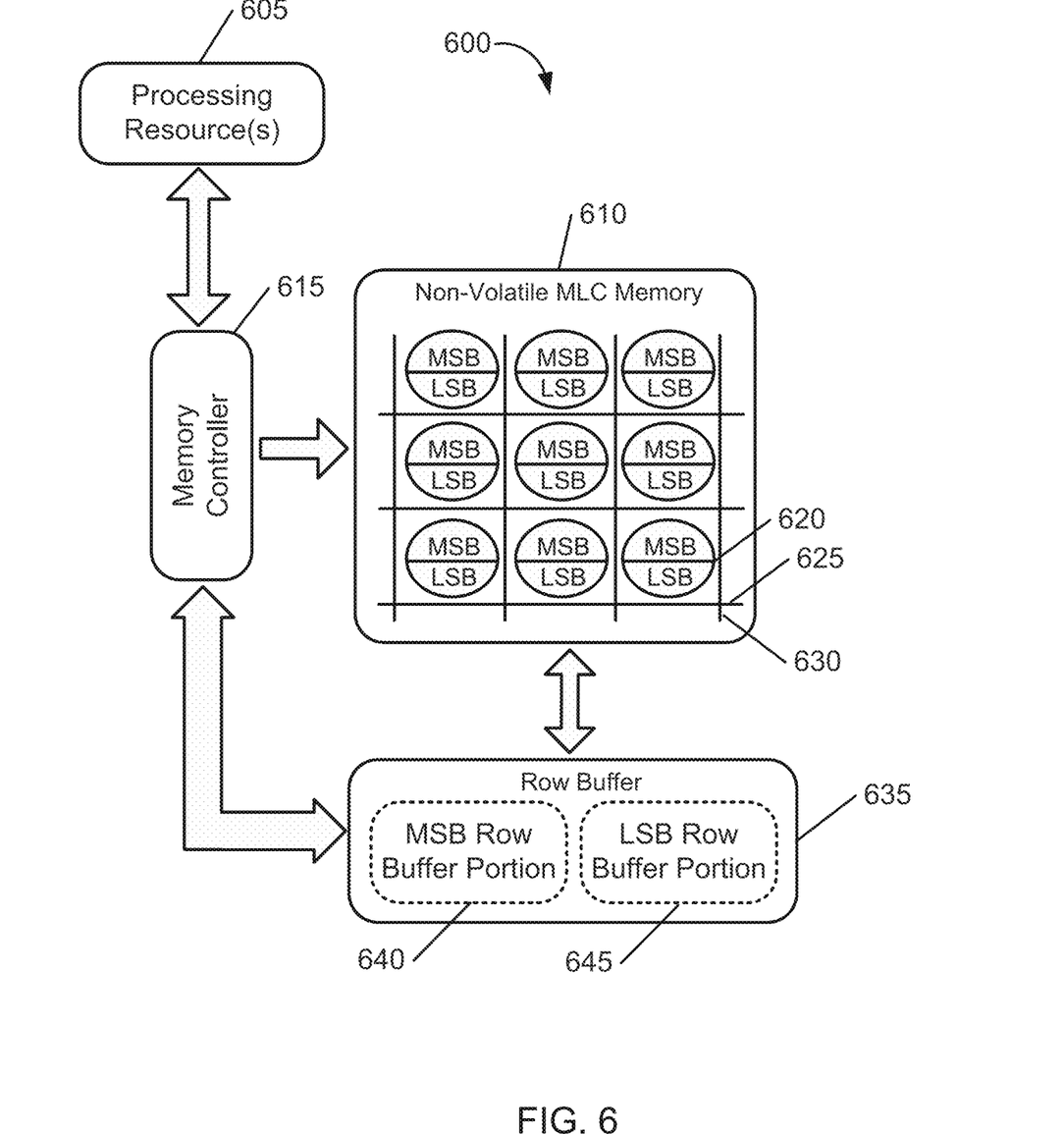
FIG. 6 is a schematic diagram of a computer system with decoupled bits in a non-volatile MLC memory for higher performance and energy efficiency.

Attention is now directed at FIG. 6, which shows a computer system with decoupled bits in a non-volatile MLC memory for higher performance and energy efficiency. Computer system 600 has a processing resource(s) 605 in communication with a non-volatile MLC memory 610 via a memory controller 615. Processing resource(s) 605 may include one or more processors and one or more other memory resources (e.g., cache memories). The non-volatile MLC memory 610 has an array of non-volatile memory cells (e.g., memory cell 620), with each multi-level memory cell storing a MSB and a LSB. The array of memory cells may be organized as an array of wordlines (rows) by bitlines (columns), such as wordline 625 and bitline 630.

The memory controller 615 provides an interface between the array of non-volatile memory cells in memory 610 and the processing resource(s) 605. The memory controller 615 reads, writes, and refreshes memory 610 through a combination of multiplexers and demultiplexers that select the right row, column, and memory location for the data. In various examples, the memory controller 615 reads and writes data to memory 610 through a row buffer 635. The row buffer 635 has a MSB buffer portion 640 and a LSB buffer portion 645 to respectively store the MSBs and LSBs from the array of non-volatile memory cells in memory 610. As described above with reference to FIGS. 4 and 5, the MSBs and LSBs in memory 610 are decoupled and mapped to separate logical addresses. Decoupling the MSBs and LSBs of the memory cells in memory 610 effectively divides a row into two half-rows, each with their own contiguous logical address. This enables the row buffer 635 to be manipulated as two half-row buffers as shown, with a MSB buffer portion 640 for storing MSBs and a LSB buffer portion 645 for storing LSBs.

With the MSBs and LSBs decoupled and accessed as separate logical addresses in row buffer portions 640-645, significant improvements in read latency and energy and write latency and energy can be achieved. When reading data from memory 610, memory controller 615 can read blocks of data from MSB buffer portion 640 at a reduced read latency and energy (with blocks of data from LSB buffer portion 645 read at a conventional read latency and energy). Similarly, when writing data to memory 610, memory controller 615 can write blocks of data to the LSB buffer portion 645 at a reduced write latency and energy (with blocks of data written to MSB buffer portion 640 at a conventional write latency and energy).

The downside of this MSB/LSB decoupling is that the memory 610 may have a worse endurance than the conventional memories where the bits are coupled. This is because in order to program M bits in a conventional bit scheme, M/2 cells undergo the physical programming cycle of heating and cooling, as two logically contiguous bits map to the same cell. However, to program M bits in memory 610, M cells undergo physical programming, as only one of the two bits is changed in each cell. Thus, in the absence of data buffering effects, decoupling the MSBs and LSBs in memory 610 consumes endurance cycles at twice the rate of conventional memories, therefore halving the memory lifetime. In the case of memory 610 being a PCM, for example, memory 610 can simply program data over whatever existing data in any location in memory, and every cell that is programmed undergoes an endurance cycle. Therefore, the number of cells involved in programming directly impacts the lifetime of the memory 610.

Figure 7:
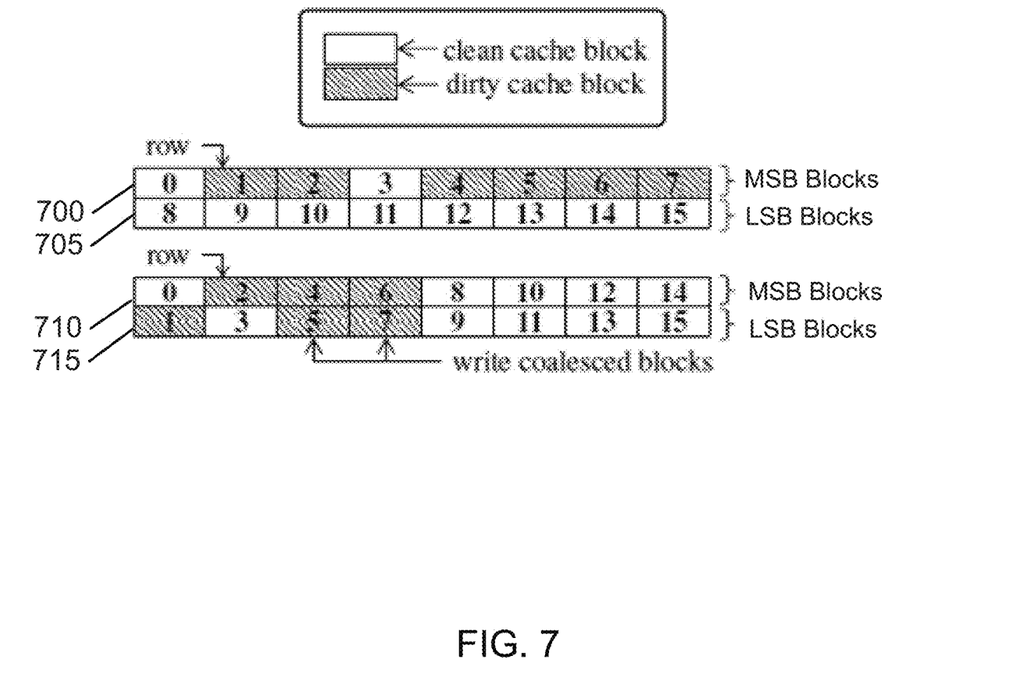
FIG. 7 illustrates the interleaving of MSBs and LSBs in a row buffer to coalesce writes to the memory.

The effects of this worse memory endurance as a result of the MSB/LSB decoupling can be mitigated by coalescing writes to MSB and LSB as a single write. Writes to the memory 610 are coalesced such that a memory cell in memory 610 may be programmed only once instead of twice. Interleaving blocks of data in the MSB buffer with blocks of data in the LSB buffer further increases the probability of coalescing writes. The interleaving is illustrated in FIG. 7. By interleaving cache blocks (the smallest unit in which memory 610 is accessed) between the two pages of a row, the spatial locality in writebacks is exploited to increase the chances of coalescing of cache block writebacks to the same cells. For coalesced writebacks, both bits of the cell may change during programming.

As shown in FIG. 7, MSB half-row 700 has eight data blocks from 0 through 7, and LSB half-row 705 has eight data blocks from 8 to 15. The MSB half-row 700 is stored in an MSB buffer portion of a row buffer (e.g., MSB buffer portion 640) and the LSB half-row 705 is stored in a LSB buffer portion of a row buffer (e.g., LSB buffer portion 645). Data stored in the row buffer 635 may be sent to a processing resource 605 where it is processed before it is returned to the row buffer 635. In doing so, some of the data may be "dirty" as shaded, indicating that these bits must be written to memory before other blocks can be read out of memory into the buffers.

Dirty cache blocks that are evicted from the last-level cache are typically issued as writebacks to memory and initially inserted into the memory controller's write buffer. Most systems prioritize row buffer hit requests (to varying degrees), hence these dirty cache blocks are queued in the memory controller's write buffer until their destination rows are accessed, at which point their data are sent to the row buffer 635. The dirty cache block data then reside in the row buffer 635 until the row buffer contents need to be evicted (i.e., to buffer in a different row), which is when the dirty cache data are actually programmed into the memory cell array.

In this example, bits 1, 2, and 4-7 are dirty. If all of these blocks are written, there will be a total of 6 separate writes to the row corresponding to MSB half-row 700 and LSB half-row 705. But if the bits are interleaved at the row buffer 635 as in half-rows 710-715 before being written back to memory, that is, if the writes are coalesced and data locality is explored, bits 4-5 and 6-7 can be written together. Instead of 6 separate writes to memory, only 4 separate writes are required. Note that the number of cache blocks that are interleaved may range from 1 to as high as the number of cache blocks that fit into a single page which is half a row).

It is appreciated that although the default scheduling policy of First Row First Come First Serve ("FR-FCFS") naturally coalesces writes at the row buffer 635, the likelihood of this happening can be improved by carefully queuing writes at the memory controller 615. A mechanism that serves this purpose is referred to as DRAM Aware Last-Level Cache Writeback ("DLW"). On every eviction of a dirty last-level cache block, DM searches the last-level cache for other dirty cache blocks that map to the same row, and speculatively issues these as writebacks to memory. The interleaving of data blocks in the row buffer 635 works synergistically with DLW, by issuing many writebacks to the same row, thus increasing the likelihood of write coalescing. It is also appreciated that the interleaving only changes how data is interpreted in the row buffer 635; its implementation does not require any changes to the memory 610. However, while calculating the cache line location within a page, the memory controller 615 should take into account the degree of interleaving and decode the address accordingly.

Figure 8:
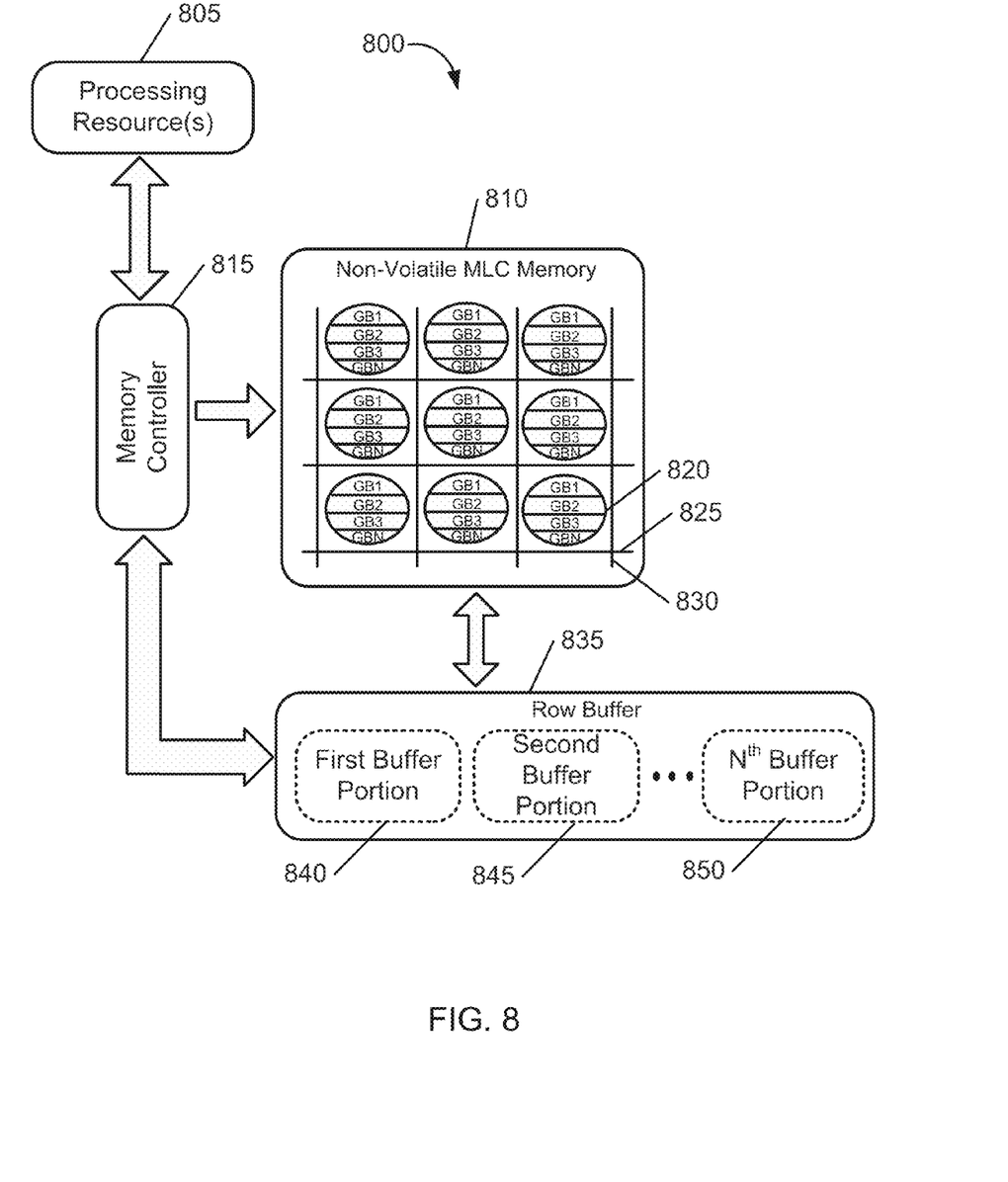
FIG. 8 is another schematic diagram of a computer system with decoupled bits in a non-volatile MLC memory for higher performance and energy efficiency.

Attention is now directed to FIG. 8, which shows another example of a computer system with decoupled bits in a non-volatile MLC memory for higher performance and energy efficiency. As mentioned above, FIGS. 1-7 described for ease of explanation examples of a memory cell having two groups of bits, with each group having a single bit (a MSB or a LSB). The computer system 800 in FIG. 8 has memory cells that can store multiple other groups of bits (and not just a MSB and a LSB). Similar to computer system 600 of FIG. 6, computer system 800 has a processing resource(s) 805 in communication with anon-volatile MLC memory 810 via a memory controller 815. Processing resource(s) 805 may include one or more processors and one or more other memory resources (e.g., cache memories). The non-volatile MLC memory 810 has an array of non-volatile memory cells (e.g., memory cell 820), with each multi-level memory cell storing multiple groups of bits labeled GB1, GB2, GB3, and so on, all the way to GBN, where N can be any integer number equal to or higher than 3 and limited by the physical constraints of the memory 810. The array of memory cells may be organized as an array of wordlines (rows) by bitlines (columns), such as wordline 825 and bitline 830.

The memory controller 815 provides an interface between the array of non-volatile memory cells in memory 810 and the processing resource(s) 805. The memory controller 815 reads, writes, and refreshes memory 810 through a combination of multiplexers and demultiplexers that select the right row, column, and memory location for the data. In various examples, the memory controller 815 reads and writes data to memory 810 through a row buffer 835. The row buffer 835 has multiple buffer portions 840-850, labeled "first buffer portion" (840), "second buffer portion" (845), and an on, all the way to the "N$^{th}$ buffer portion" (850). Each buffer portion 840-850 can store a group of bits from the memory cell 820. For example, buffer portion 840 can store GB1, buffer portion 845 can store GB2, and buffer portion 850 can store GBN. Each buffer portion 840-850 has a different read latency and energy and a different write latency and energy.

Figure 9:
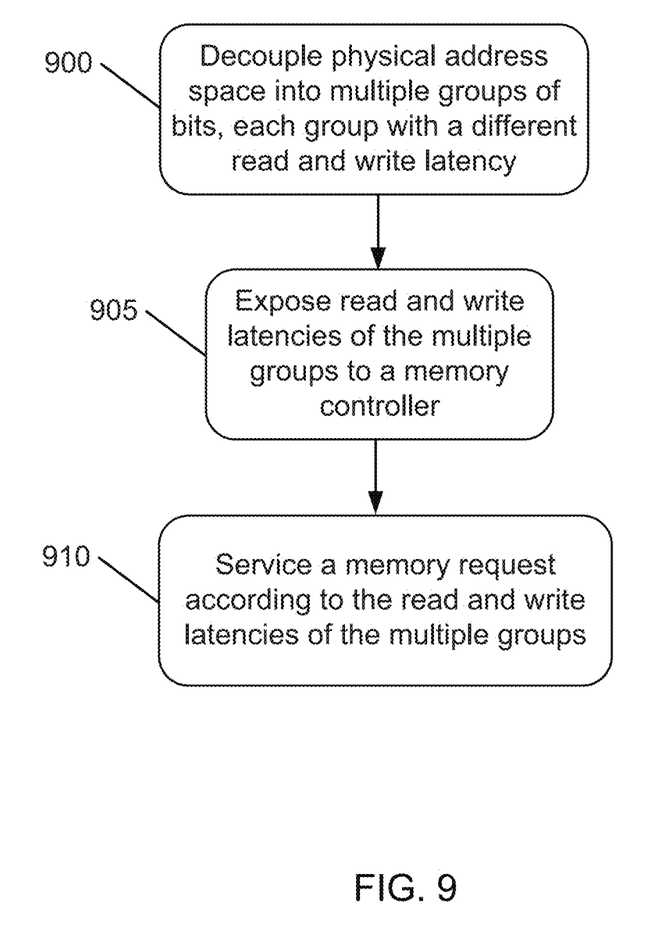
FIG. 9 is a flowchart for decoupling bits in a non-volatile MLC memory for higher performance and energy efficiency.

Attention is now directed to FIG. 9, which shows a flowchart for decoupling bits in a non-volatile MLC memory for higher performance and energy efficiency. First, the physical address space of the non-volatile MLC memory is decoupled into multiple groups of bits, with each group having a different read and write latency (900). For example, one group of bits could be an MSB with a reduced read latency and another group could be a LSB with a reduced write latency. The different read and write latencies of the multiple groups of bits are exposed to the memory controller (905). The memory controller services a memory request (e.g., a read or write request) according to the read and write latencies of the multiple groups (910).

Figure 10:
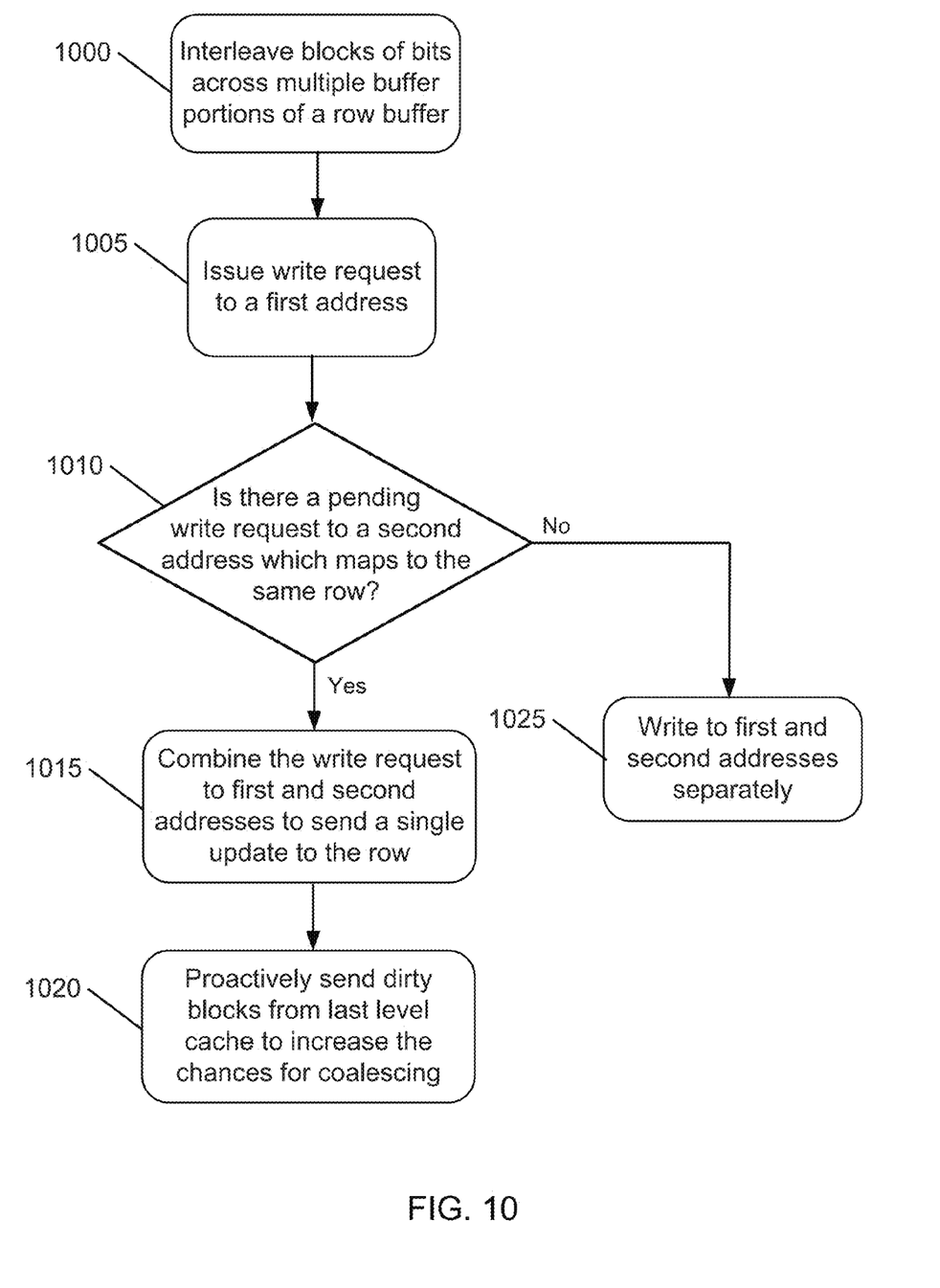
FIG. 10 is a flowchart for coalescing writes to a non-volatile MLC memory for higher performance and efficiency.

FIG. 10 is a flowchart for coalescing writes to a non-volatile MLC memory for higher performance and efficiency. First, when mapping a page to physical memory, blocks of bits across multiple row buffer portions are interleaved, e.g., blocks of bits from an MSB buffer portion are interleaved with blocks of bits from an LSB buffer portion as described above with reference to FIG. 7 (1000). Next, the memory controller issues a write request to a first address (1005). If there is a pending write request to a second address which maps to the same row and the same set of cells in the memory (1010), then the first and second write requests are combined into a single coalesced write to make a single write update to the memory row (1015). Otherwise, the first and second addresses are written to separately (1025). The memory controller, while scheduling write requests, can proactively send dirty blocks from the last level cache to the memory if there are chances for coalescing (1020).

Advantageously, the decoupling of bits in a non-volatile MLC memory enables the read and write asymmetries with respect to read and write latency and energy to be explored. MSBs are read at a reduced latency and energy, while LSBs are written at a reduced latency and energy. Interleaving MSBs and LSBs in the row buffer before writing them to memory coalesces the writes and mitigates the endurance effects of the bit decoupling.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A non-volatile multi-level cell ("MLC") memory device, comprising:
    an array of non-volatile memory cells, each non-volatile memory cell to store multiple groups of bits, each group of bits among the multiple groups being mapped to logically separate memory addresses;
    a row buffer having multiple buffer portions, each buffer portion to store one or more bits from the memory cells and having different read and write latencies and energies; and
    a memory controller to issue write requests to different bits in a set of non-volatile memory cells in the array of non-volatile memory cells and instruct the memory device to coalesce the write requests to make a single write to the set of non-volatile memory cells.

2. The non-volatile MLC memory device of claim 1, wherein the first group of bits is stored in a first buffer portion and the second group of bits is stored in a second buffer portion, and wherein blocks of bits from the first buffer portion are interleaved with blocks of bits from the second buffer portion to coalesce writes at the row buffer.

3. The non-volatile MLC memory device of claim 1, wherein the row buffer comprises a plurality of sense amplifiers and analog to digital converters, each sense amplifier connected to a bit line.

4. The non-volatile MLC memory device of claim 3, wherein each analog to digital converter is connected to a plurality of latches to hold the multiple groups of bits.

5. The non-volatile MLC memory device of claim 3, wherein the read latency depends on a time taken by the plurality of sense amplifiers to sense a resistance of each non-volatile memory cell.

6. The non-volatile MLC memory device of claim 1, wherein the write latency depends on an initial state of the non-volatile memory cells and a target state of the non-volatile memory cells.

7. The non-volatile MLC memory device of claim 1, wherein:
    a first group of bits among the multiple groups of bits is a most-significant bit (MSB); and
    a second group of bits among the multiple groups of bits is a least-significant bit (LSB).

* * * * *